(12) United States Patent
Lin et al.

(10) Patent No.: US 9,851,158 B2
(45) Date of Patent: Dec. 26, 2017

(54) HEAT SINK STRUCTURE

(71) Applicant: Asia Vital Components Co., Ltd., New Taipei (TW)

(72) Inventors: Sheng-Huang Lin, New Taipei (TW); Kuo-Sheng Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 15/591,357

(22) Filed: May 10, 2017

(65) Prior Publication Data

US 2017/0241720 A1    Aug. 24, 2017

Related U.S. Application Data

(63) Continuation of application No. 13/610,254, filed on Sep. 11, 2012, now abandoned.

(30) Foreign Application Priority Data

Aug. 1, 2012  (TW) .............................. 101127729 A

(51) Int. Cl.
| | |
|---|---|
| *F21V 29/00* | (2015.01) |
| *F28F 1/16* | (2006.01) |
| *F28D 21/00* | (2006.01) |
| *B23P 19/027* | (2006.01) |
| *B23P 15/26* | (2006.01) |
| *H01L 21/48* | (2006.01) |

(Continued)

(52) U.S. Cl.
CPC ................ *F28F 1/16* (2013.01); *B23P 15/26* (2013.01); *B23P 19/027* (2013.01); *F28D 21/00* (2013.01); *H01L 21/4882* (2013.01); *B23P 2700/10* (2013.01); *F21V 29/773* (2015.01); *F28D 2021/0029* (2013.01); *F28F 2275/10* (2013.01); *H01L 23/3672* (2013.01)

(58) Field of Classification Search
None
See application file for complete search history.

(56) References Cited

U.S. PATENT DOCUMENTS

| | | |
|---|---|---|
| 1,655,662 A | 1/1928 | Repay |
| 2,289,984 A | 7/1942 | Mouromtseff |

(Continued)

FOREIGN PATENT DOCUMENTS

| | | |
|---|---|---|
| CN | 1959967 A | 5/2007 |
| TW | M409370 U1 | 8/2011 |
| TW | 201141618 A1 | 12/2011 |

*Primary Examiner* — Allen Flanigan
(74) *Attorney, Agent, or Firm* — C. G. Mersereau; Nikolai & Mersereau, P.A.

(57) ABSTRACT

A heat sink structure and a manufacturing method thereof. The heat sink includes a main body having multiple main body connection sections and multiple radiating fins each having a connection section. The main body has a first end and a second end. The first and second ends define a longitudinal direction. The multiple radiating fins are placed in a mold. A mechanical processing measure is used to high-speed impact the main body so as to thrust the main body into the mold. Accordingly, the connection sections of the radiating fins placed in the mold are high-speed thrust into the main body connection sections and moved in the longitudinal direction to the second end of the main body to tightly integrally connect with the main body.

5 Claims, 24 Drawing Sheets

(51) Int. Cl.
*H01L 23/367* (2006.01)
*F21V 29/77* (2015.01)

(56) References Cited

U.S. PATENT DOCUMENTS

| | | |
|---|---|---|
| 2,535,721 A | 12/1950 | Chausson |
| 4,369,838 A | 1/1983 | Asanuma et al. |
| 5,014,776 A | 5/1991 | Hess |
| 6,633,484 B1 | 10/2003 | Lee et al. |
| 7,286,352 B2 * | 10/2007 | Curtis .................... F28F 21/02 165/80.3 |
| 7,497,248 B2 | 3/2009 | Hegde |
| 2003/0048608 A1 | 3/2003 | Crocker et al. |
| 2010/0162551 A1 | 7/2010 | Chen |
| 2011/0051430 A1 | 3/2011 | Chen |

* cited by examiner

HEAT SINK STRUCTURE

CROSS-REFERENCE TO RELATED APPLICATIONS

The present application is a continuation of U.S. patent application Ser. No. 13/610,254, filed on Sep. 11, 2012, titled Heat Sink Structure and Manufacturing Method Thereof, listing Sheng-Huang Lin and Kuo-Sheng Lin, as inventors. This application claims the priority benefit of Taiwan patent application number 101127729 filed on Aug. 1, 2012.

BACKGROUND OF THE INVENTION

1. Field of the Invention

The present invention relates generally to a heat sink structure and a manufacturing method thereof, and more particularly to an annular heat sink structure and a manufacturing method thereof.

2. Description of the Related Art

The conventional cylindrical heat sink includes a cylindrical body and multiple radiating fins connected to the circumference of the cylindrical body. There are several conventional measures for connecting the radiating fins to the circumference of the cylindrical body. For example, a prior art discloses a cylindrical heat sink and a method of tightly planting radiating fins of the heat sink and an application device thereof. According to the method, a mold seat drivable by a power source to create stepped rotational operation is provided. A cylindrical body is located on the mold seat. The circumference of the cylindrical body is formed with multiple channels. A radiating fin assembly is provided. The radiating fin assembly includes multiple radiating fins arranged on a lateral side of the mold seat. The cylindrical body intermittently rotates to drive and align the channels with the radiating fins. A radiating fin insertion device is used to push the radiating fins and sequentially insert and locate the radiating fins into the channels of the cylindrical body. After the radiating fins are fully inserted in the channels of the cylindrical body, a successive tightening process is performed to tightly integrally connect the radiating fins to the channels. Accordingly, the radiating fins are located on the circumference of the cylindrical body to form a heat sink.

Another prior art discloses a tightening method for a heat sink. The heat sink includes a heat conduction base seat and a radiating fin assembly. One surface of the base seat is formed with multiple channels and guide grooves positioned between two channels. The radiating fin assembly includes multiple radiating fins. A mold having an internal space and a press end section is provided. A tightening/connection process is performed to press and insert the heat sink into the internal space of the mold. The press end section is axially thrust into the guide grooves to compress and deform the channels. At this time, the radiating fins are pressed to tightly integrally connect with the deformed channels. The above method is better than the pressing and riveting method of the conventional heat sink. The breakage of the puncher or blade mold can be effectively reduced to promote the ratio of good products. Also, the precision and quality of the products are increased. This method is conveniently applicable to various heat sinks to form different types or shapes of heat sinks.

In both the above methods, the radiating fin is first inserted into a channel and then a mold is used to press the guide grooves on two sides of the channel to deform the channel and press the radiating fin to tightly integrally connect the radiating fin with the deformed channel. Such process has some problems as follows:

1. The outer surface of the cylindrical body not only is formed with the channels, but also is formed with the guide grooves. The channels and the guide grooves are alternately arranged. That is, the number of the channels per unit surface area is reduced. As a result, the number of the mounted radiating fins is reduced.
2. The manufacturing method includes numerous steps so that the manufacturing time is quite long.

SUMMARY OF THE INVENTION

It is therefore a primary object of the present invention to provide a heat sink structure and a manufacturing method thereof. The main body and the radiating fins of the heat sink structure are connected by means of high-speed impact.

It is a further object of the present invention to provide the above heat sink structure, in which the main body connection section of the first connection section is formed with a raised/recessed non-planar surface to enhance connection friction.

It is still a further object of the present invention to provide the above heat sink structure and the manufacturing method thereof, in which the number of the radiating fins per unit surface area is increased.

It is still a further object of the present invention to provide the above heat sink structure and the manufacturing method thereof, in which the heat sink structure has better heat dissipation efficiency.

It is still a further object of the present invention to provide the above heat sink structure, in which at least one radiating fin is connected to each main body connection section.

It is still a further object of the present invention to provide the above heat sink structure, in which the main body connection sections are channels radially distributed over the circumference of the main body. The main body connection sections are normal to the surface of the main body or inclined to the surface of the main body.

It is still a further object of the present invention to provide the above heat sink structure, in which the radiating fin is straight without bending or is formed with at least one bending angle.

To achieve the above and other objects, the heat sink structure of the present invention includes: a main body having a first end and a second end, the first and second ends defining a longitudinal direction, multiple main body connection sections being formed between the first and second ends and distributed over a circumference of the main body; and multiple first radiating fins connected with the circumference of the main body, each first radiating fin having a first connection section corresponding to the main body connection section, a mechanical processing measure being used to high-speed impact the main body toward the first radiating fins, whereby the first connection sections of the first radiating fins are high-speed thrust from the first end of the main body into the main body connection sections and moved in the longitudinal direction to the second end to tightly integrally connect with the main body.

In the above heat sink structure, the main body connection section is a connection channel or a rib, while the first connection section is a first end edge of the first radiating fin or a connection channel in adaptation to the main body connection section. The main body connection section is connected with the first connection section by means of press fit. The first connection section corresponds to outer surface of the main body and has a guide section. The guide section is a round angle or a reverse angle or a right angle. The main body is formed with multiple thrust sections in communication with the main body connection sections.

In the above heat sink structure, one of the main body connection section and the first connection section is formed with a raised/recessed non-planar surface, while the other of the main body connection section and the first connection section is formed with a planar surface or a raised/recessed non-planar surface.

In the above heat sink structure, each main body connection section has an opening and a bottom end. A straight extension line is defined from the opening to the bottom end. The main body connection sections are radially distributed over the circumference of the main body with the straight extension line passing through the center of the main body.

In the above heat sink structure, each main body connection section has an opening and a bottom end. A straight extension line is defined from the opening to the bottom end. The main body connection sections are inclined to the surface of the main body with the straight extension line not passing through the center of the main body.

In the above heat sink structure, the first connection section of the first radiating fin is formed with a first bending root section.

In the above heat sink structure, the first radiating fin is straight without bending or is formed with at least one first bending angle.

The above heat sink structure further includes multiple second radiating fins. Each second radiating fin has a second connection section immediately adjacent to the first connection section of the first radiating fin. Along with the first connection section, the second connection section is high-speed thrust into the main body connection section from the first end of the main body to the second end in the longitudinal direction, whereby one first connection section and one second connection section are tightly integrally fitted in each main body connection section with the first radiating fin adjacent to the second radiating fin.

In the above heat sink structure, the second connection section is a second end edge of the second radiating fin.

In the above heat sink structure, the second radiating fin is straight without bending or is formed with at least one second bending angle. The angle of the first bending angle is equal to or unequal to the angle of the second bending angle.

In the above heat sink structure, the first radiating fin is made of a first material, while the second radiating fin is made of a second material. The first material is a metal material and the second material is also a metal material. The first material is identical or not identical to the second material. The metal is selected from a group consisting of gold, silver, copper, aluminum and an alloy thereof.

In the above heat sink structure, the first radiating fin has a first thickness and the second radiating fin has a second thickness. The first thickness is equal to or unequal to the second thickness.

In the above heat sink structure, the first connection section of the first radiating fin is formed with a first bending root section and the second connection section of the second radiating fin is formed with a second bending root section.

The manufacturing method of the heat sink of the present invention includes steps of: providing a mold, the mold having an inner circumference, an upper surface and multiple splits, the inner circumference defining an internal space, the multiple splits being radially formed around the internal space in communication with the internal space and downward extending from the upper surface; providing a main body having a first end and a second end, the first and second ends of the main body defining a longitudinal direction, multiple main body connection sections being formed between the first and second ends and distributed over a circumference of the main body, the first end of the main body being aimed at the internal space; providing multiple radiating fins, the radiating fins being received in the splits, at least one radiating fin being placed in each split, each radiating fin having a connection section, the connection sections of the radiating fins protruding from the inner circumference of the mold; and using a mechanical processing measure to high-speed impact the main body so as to thrust the main body into the internal space and move the main body relative to the multiple radiating fins, whereby the connection sections of the radiating fins are high-speed thrust into the main body connection sections and moved in the longitudinal direction to the second end to tightly integrally connect with the main body.

In the above manufacturing method of the heat sink, the main body is temporarily positioned above the mold and the mechanical processing measure is an air compression apparatus for creating compressed air to thrust the main body into the internal space. A central body is disposed in the internal space in alignment with the main body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
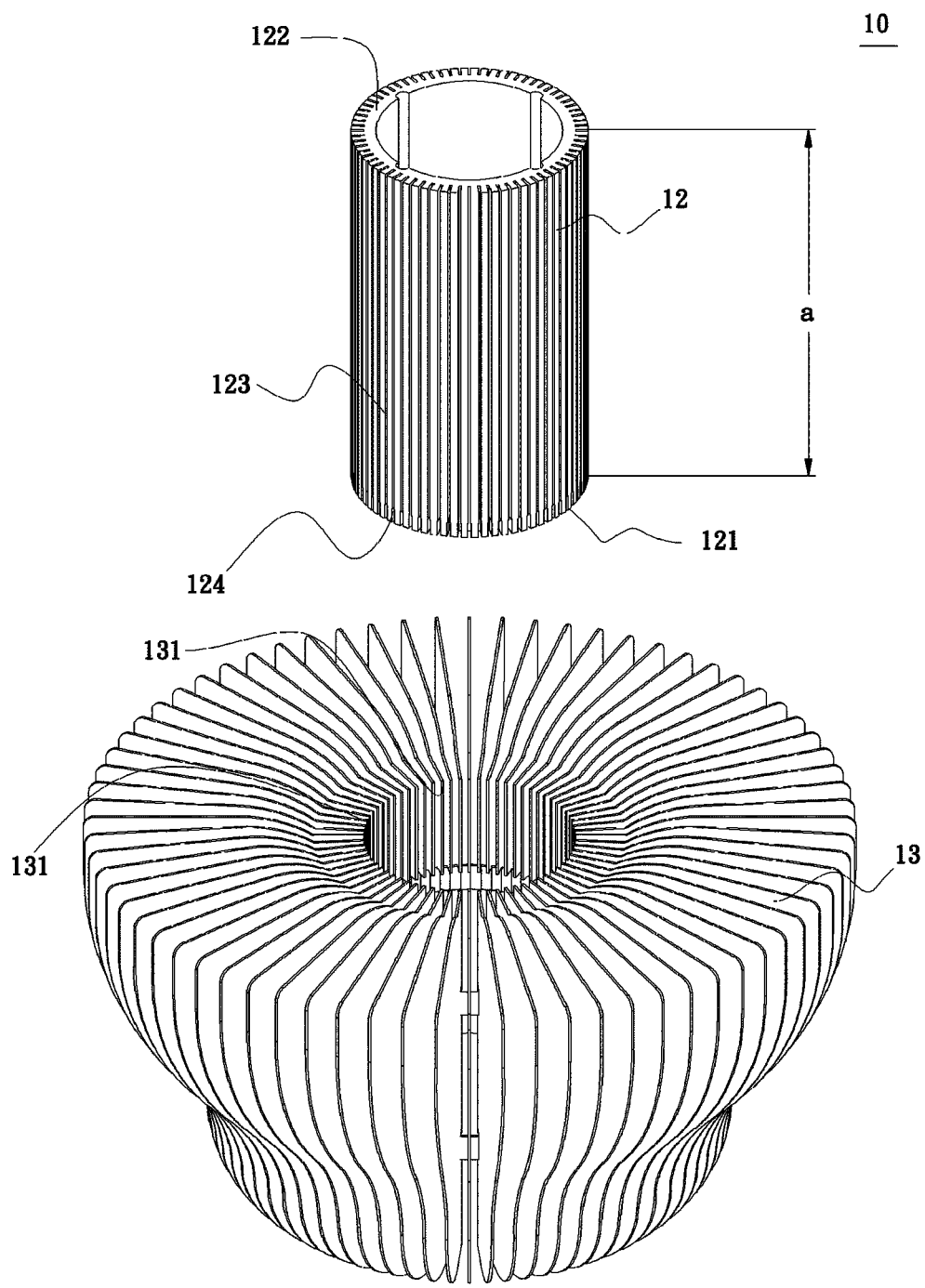
FIG. 1 is a perspective exploded view of the present invention.
Figure 2:
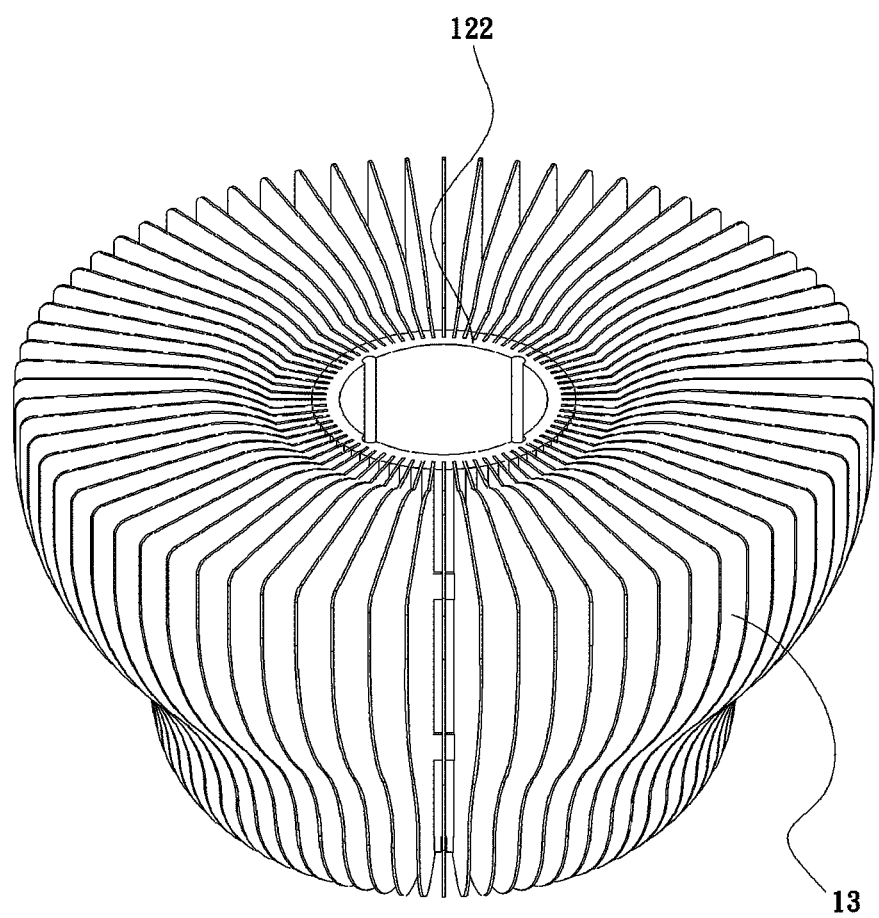
FIG. 2 is a perspective assembled view of the present invention.

Please refer to FIGS. 1 and 2. FIG. 1 is a perspective exploded view of the present invention. FIG. 2 is a perspective assembled view of the present invention. The heat sink 10 of the present invention includes a main body 12 and multiple first radiating fins 13 connected to an outer circumference of the main body 12. The main body has a first end 121 and a second end 122.

As shown in FIG. 1, the first and second ends 121, 122 of the main body 12 define a longitudinal direction a. Referring to FIG. 4B, multiple main body connection sections 123 are formed on the surface of the main body and extend from the first end 121 to the second end 122 in the longitudinal direction a. (The main body connection sections 123 are distributed over the outer circumference of the main body equivalently or inequivalently). The main body 12 is formed with multiple thrust sections 124 near the first end 121 in communication with the main body connection sections 123 (as shown in FIG. 4B). The thrust sections 124 make it easier to fit the first radiating fins 13 into the main body connection sections 123 from the first end 121 of the main body 12. The form of the thrust sections 124 is varied with the form of the main body connection sections 123. This will be detailedly described hereinafter.

As shown in FIGS. 1 and 2, the multiple first radiating fins 13 are annularly arranged around the surface of the main body 12. Each first radiating fin 13 has a first connection section 131 corresponding to the main body connection section 123 of the main body 12. The first connection section 131 can be thrust into the main body connection section 123 from the first end 121 to the second end 122 in the longitudinal direction a so as to integrally connect the first radiating fin 13 with the main body 12.

Figure 3A:
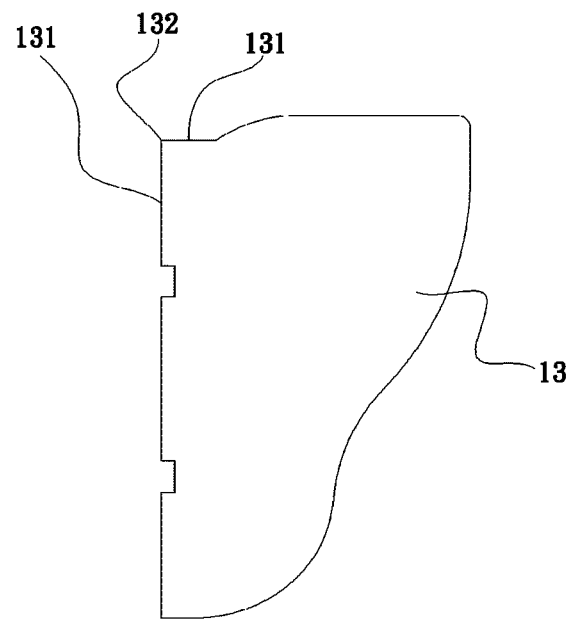
FIG. 3A is a plane view of the radiating fin of the present invention.
Figure 3B:
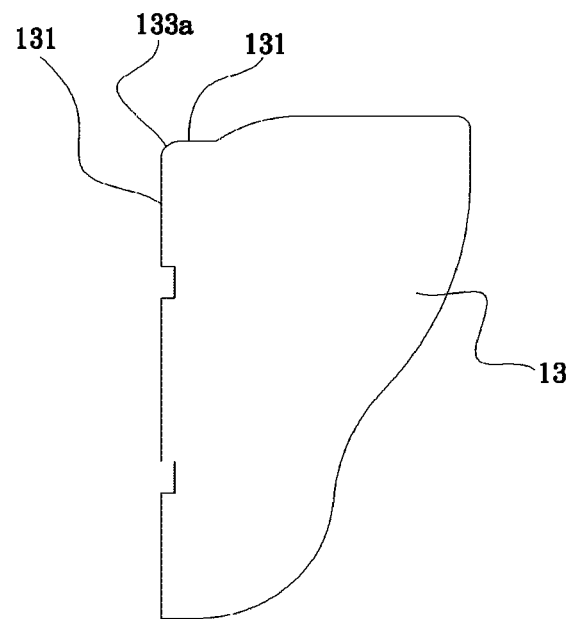
FIG. 3B is a plane view of the radiating fin of the present invention in another aspect.
Figure 3C:
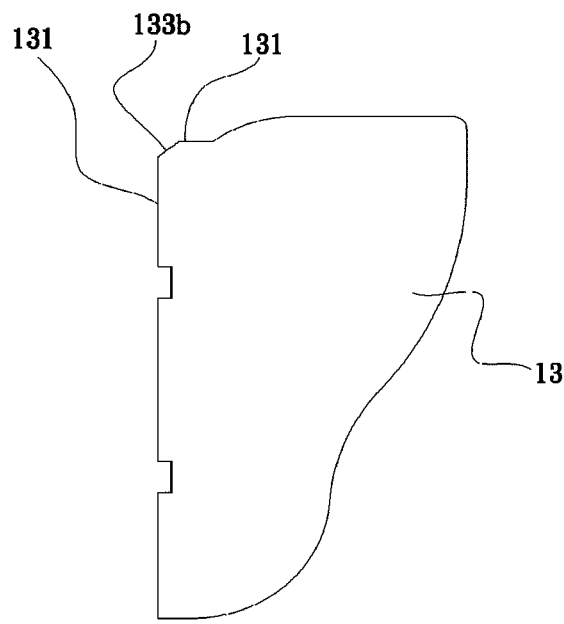
FIG. 3C is a plane view of the radiating fin of the present invention in still another aspect.

Further referring to FIGS. 3A to 3C, the first connection section 131 is formed with a right angle 132 or a guide section. For example, the guide section is, but not limited to, a round angle 133a or a reverse angle 133b. By means of the guide section, the first connection section 131 can be easily and smoothly thrust into the thrust section 124 and the main body connection section 123.

Figure 4A:
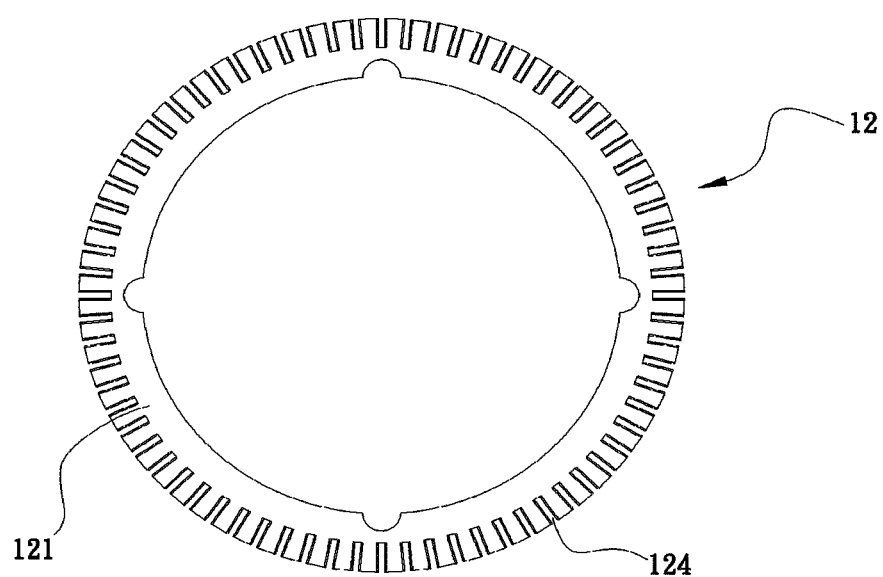
FIG. 4A is a top view of the main body of the present invention.
Figure 4B:
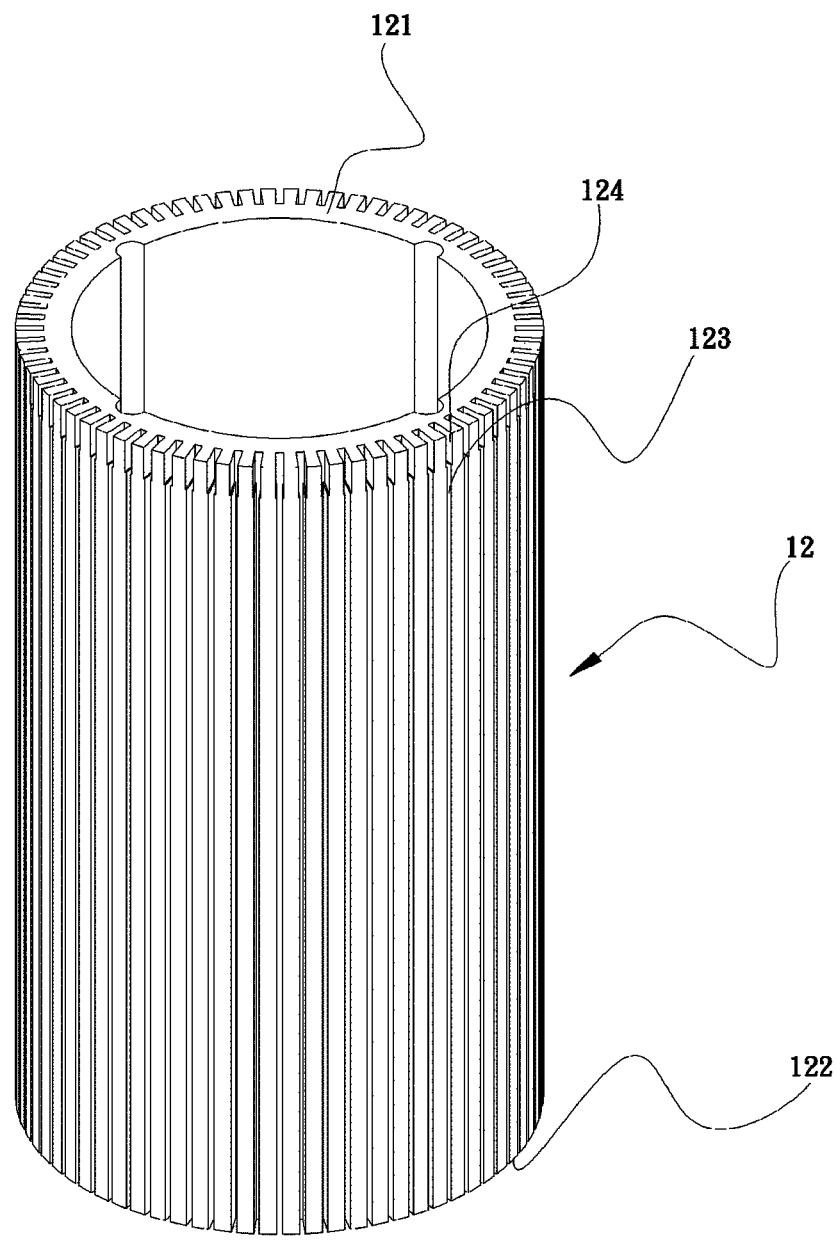
FIG. 4B is a perspective view of the main body of the present invention.
Figure 4C:
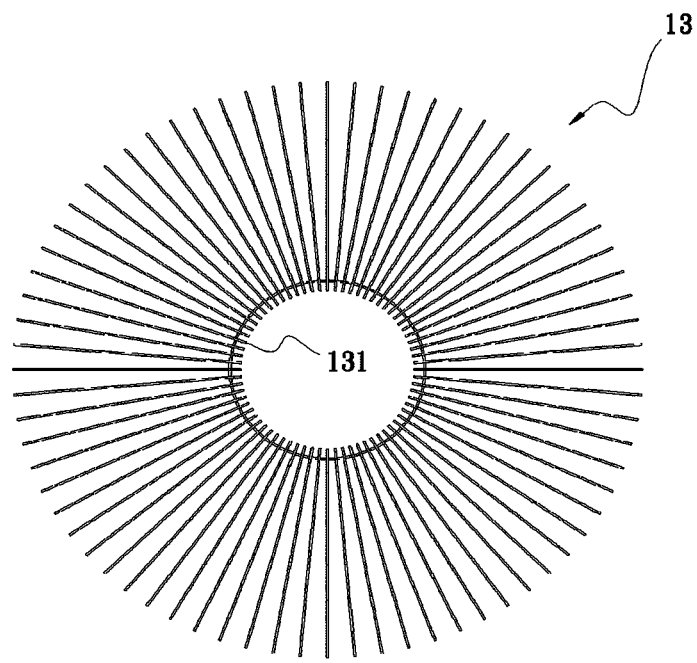
FIG. 4C is a top view showing the radiating fins of the present invention.

Please further refer to FIGS. 4A to 4C. Also referring to FIG. 3A, in a preferred embodiment, the main body connection section 123 is a connection channel and the thrust section 124 is also a connection channel. The thrust section 124 has a width slightly larger than that of the main body connection section 123 (as shown in FIGS. 4A and 4B). The first connection section 131 is a first end edge of the first radiating fin 13 (as shown in FIGS. 3A and 4C). The first connection section 131 is connected to the main body connection section 123 (as shown in FIG. 4B) by means of press fit.

Figure 5A:
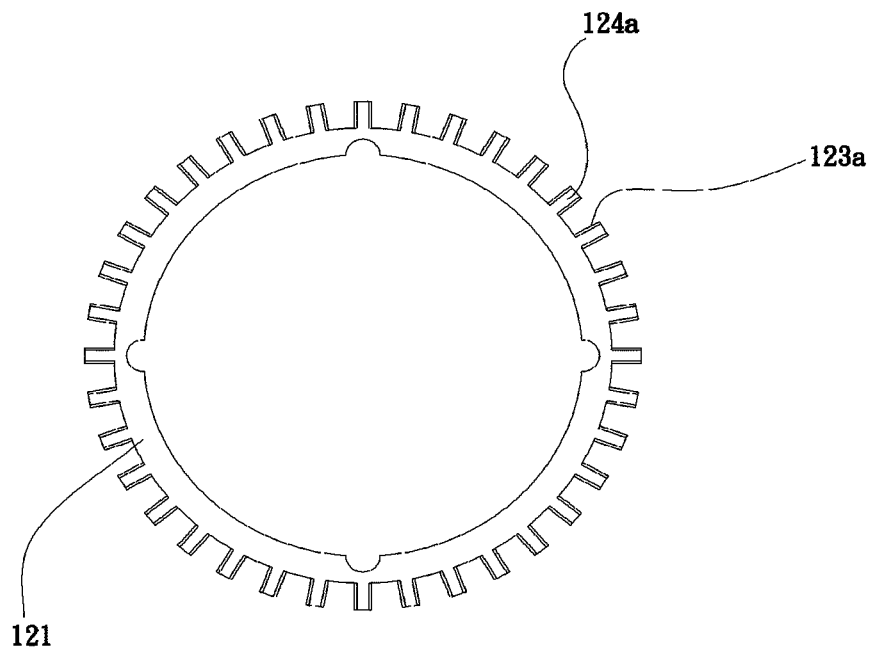
FIG. 5A is a top view of the main body of the present invention in another aspect.
Figure 5B:
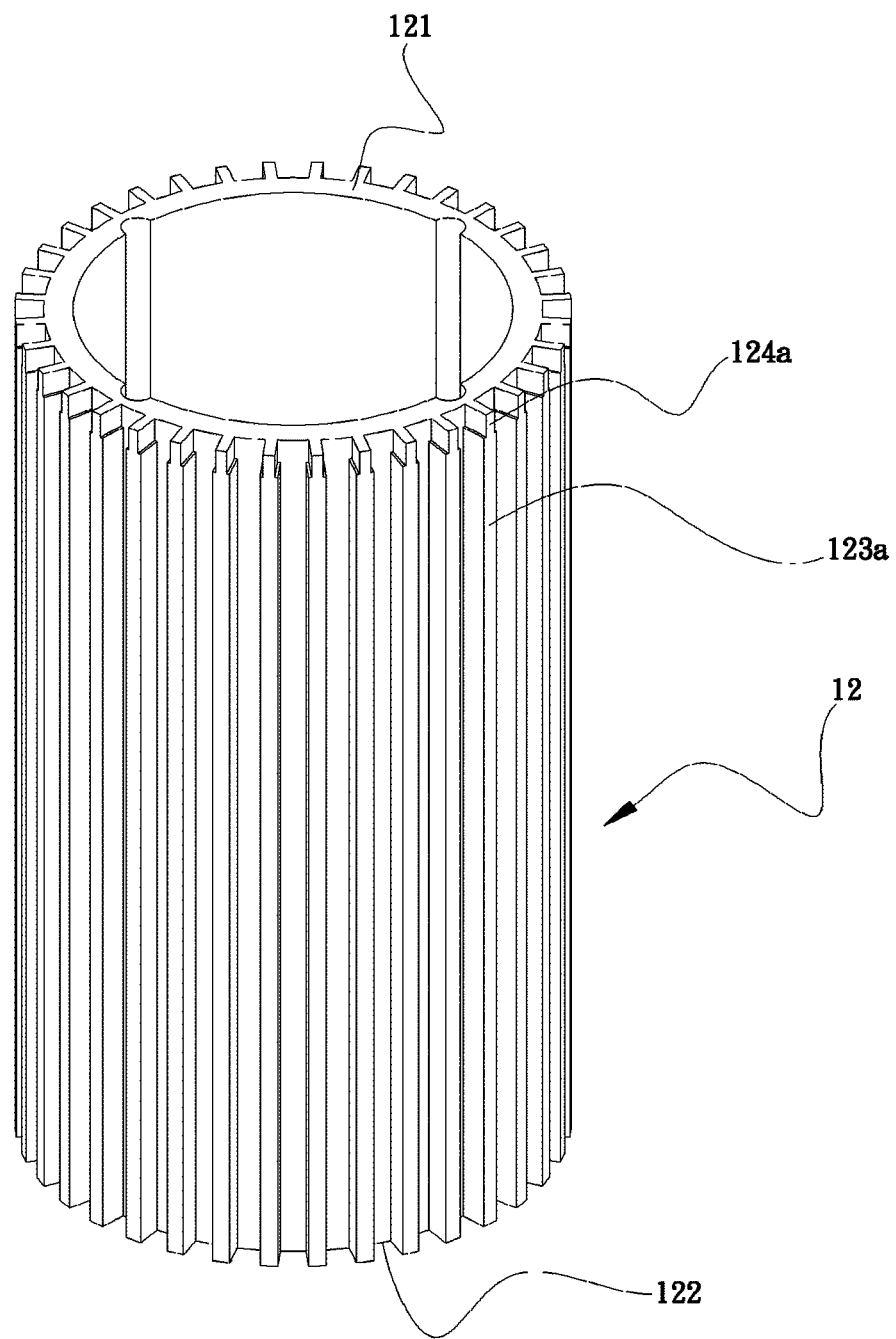
FIG. 5B is a perspective view of the main body of the present invention in the other aspect.
Figure 5C:
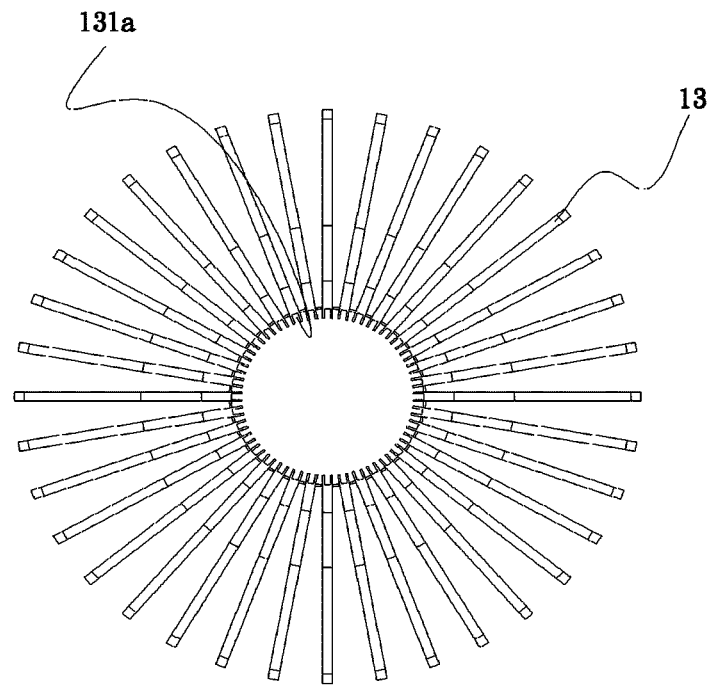
FIG. 5C is a top view showing the radiating fins of the present invention in another aspect.
Figure 5D:
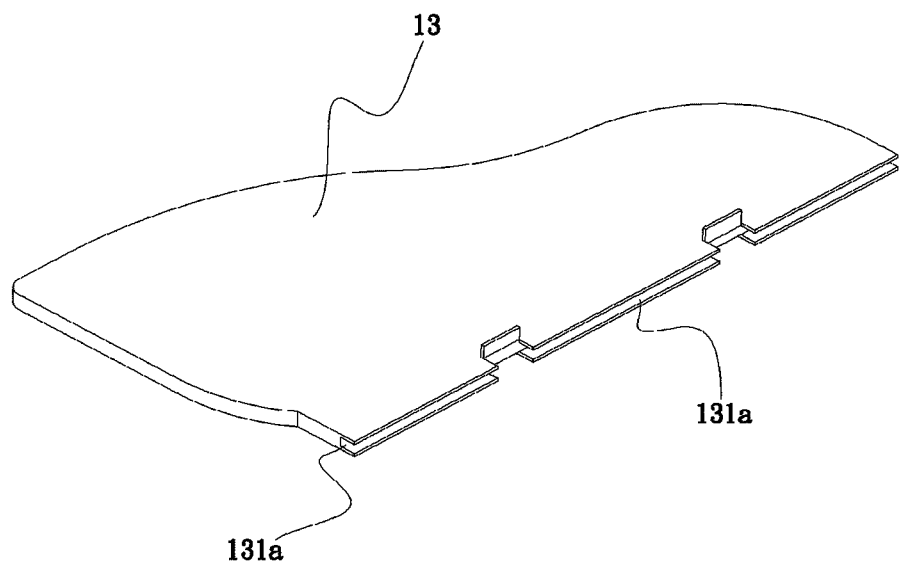
FIG. 5D is a perspective view of one single radiating fin of the present invention in the other aspect.

Please further refer to FIGS. 5A to 5D. In another embodiment, the main body connection sections 123a are ribs and the thrust sections 124a are also ribs. The thrust section 124a has a width slightly smaller than that of the main body connection section 123a (as shown in FIGS. 5A and 5B). The first connection section 131a is a connection channel (as shown in FIGS. 5C and 5D). The first connection section 131A is connected to the main body connection section 123A (as shown in FIG. 5A) by means of press fit.

Figure 6A:
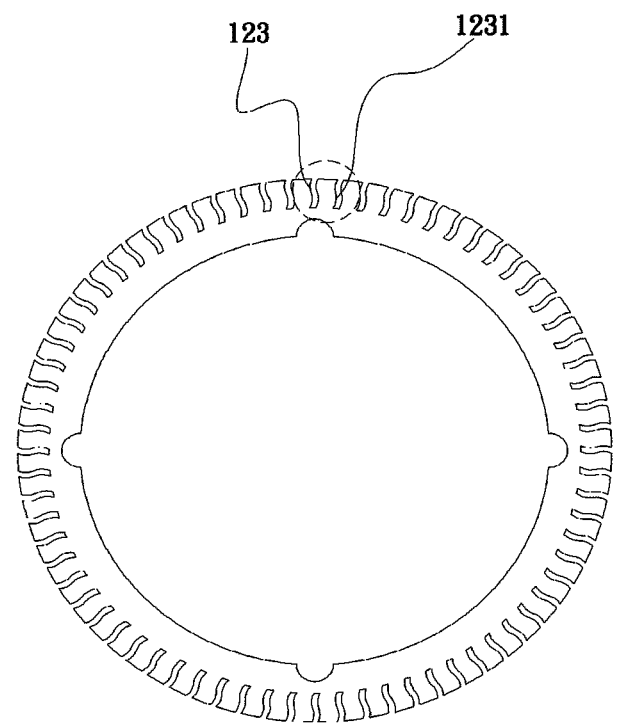
FIG. 6A is a view showing that the main body connection section of the main body of the present invention is formed with raised/recessed non-planar surface.
Figure 6B:
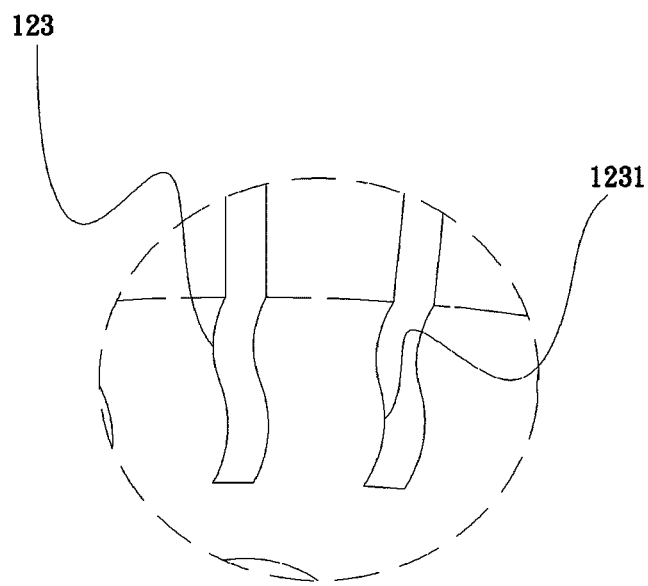
FIG. 6B is an enlarged view of circled area of FIG. 6A.
Figure 6C:
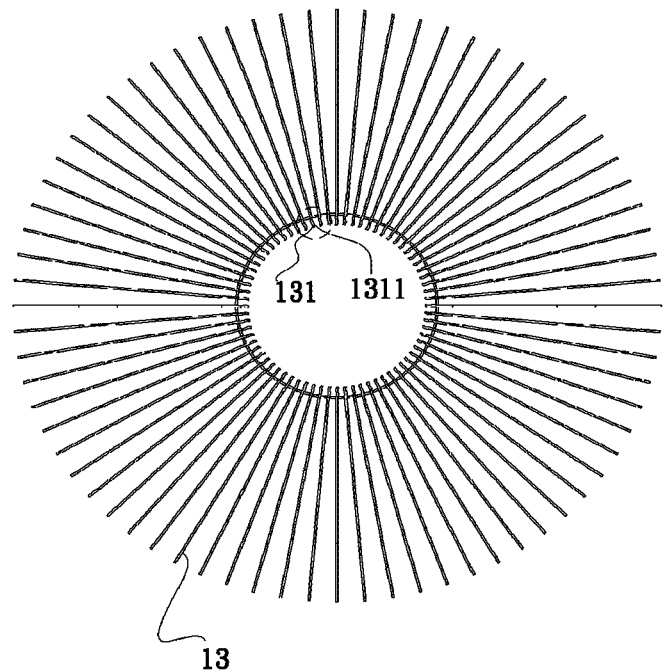
FIG. 6C is a view showing that the first connection section of the radiating fin of the present invention is formed with raised/recessed non-planar surface.
Figure 6D:
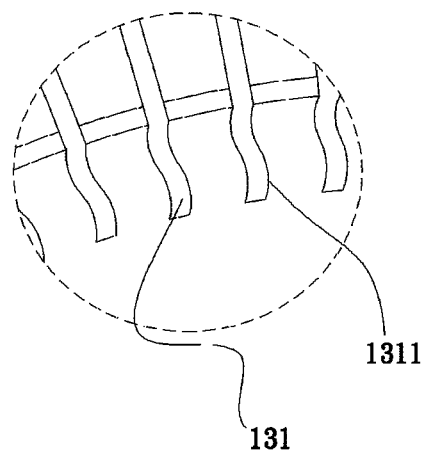
FIG. 6D is an enlarged view of circled area of FIG. 6C.

Please further refer to FIGS. 6A and 6B. In another embodiment, the main body connection section 123 is formed with a raised/recessed non-planar surface 1231, while the first connection section 131 has a planar surface (as shown in FIG. 4C). Alternatively, as shown in FIGS. 6C and 6D, in another embodiment, the first connection section 131 is formed with a raised/recessed non-planar surface 1311 and the main body connection section 123 has a planar surface (as shown in FIG. 4A). This can enhance the connection friction therebetween to avoid detachment of the first connection section 131. The configurations of the main body connection section and the first connection section are not limited to the above embodiments. In still another embodiment, both the main body connection section 123 and the first connection section 131 are formed with raised/recessed non-planar surfaces 1231, 1311, which are mated with each other (as shown in FIGS. 6A to 6D).

Many embodiments of the main body connection sections 123 of the main body 12 and the first radiating fins 13 will be described hereinafter.

Figure 7A:
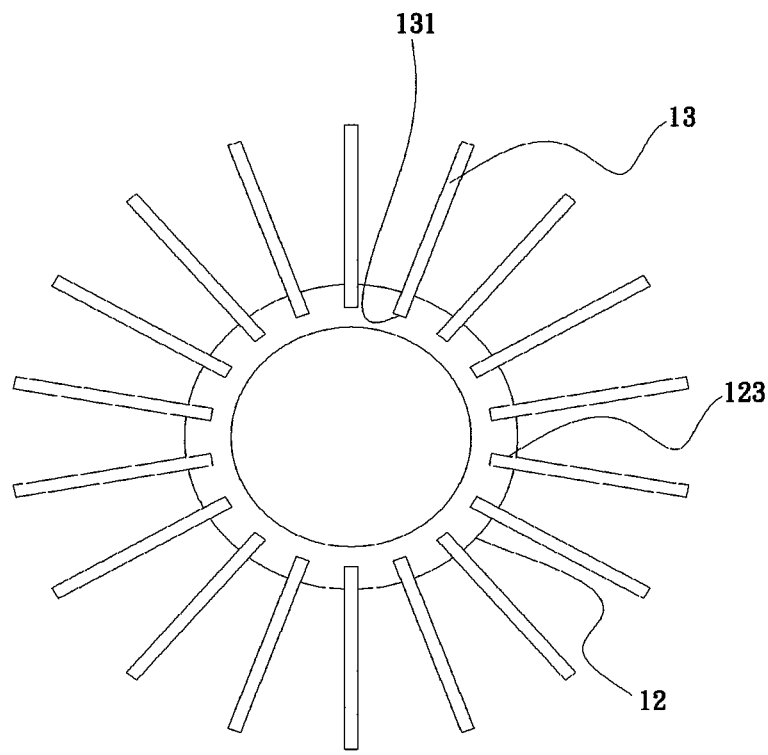
FIG. 7A is a view showing that the first connection section is connected to the main body connection section in a first state.

As shown in FIG. 7A, the main body connection sections 123 are connection channels radially distributed over the circumference of the main body 12. The main body connection sections 123 are normal to the surface of the main body 12. The first radiating fin 13 is straight from the first connection end 131 to an outer free end without bending.

Figure 7B:
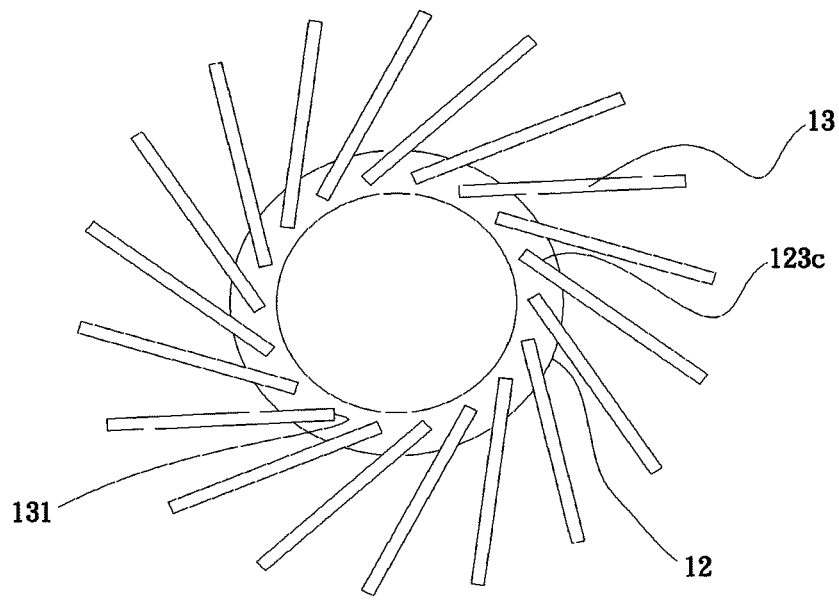
FIG. 7B is a view showing that the first connection section is connected to the main body connection section in a second state.

As shown in FIG. 7B, in another embodiment, the main body connection sections 123 are connection channels radially distributed over the circumference of the main body 12. The main body connection sections 123 are inclined to the surface of the main body 12. The first radiating fin 13 is straight from the first connection end 131 to an outer free end without bending.

Figure 7C:
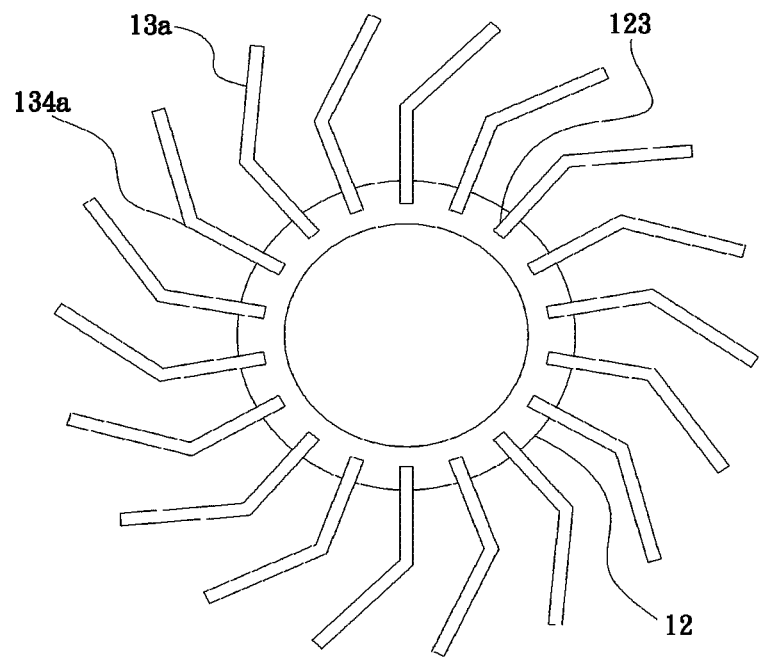
FIG. 7C is a view showing that the first connection section is connected to the main body connection section in the first state, in which the radiating fin has a bending angle.
Figure 7D:
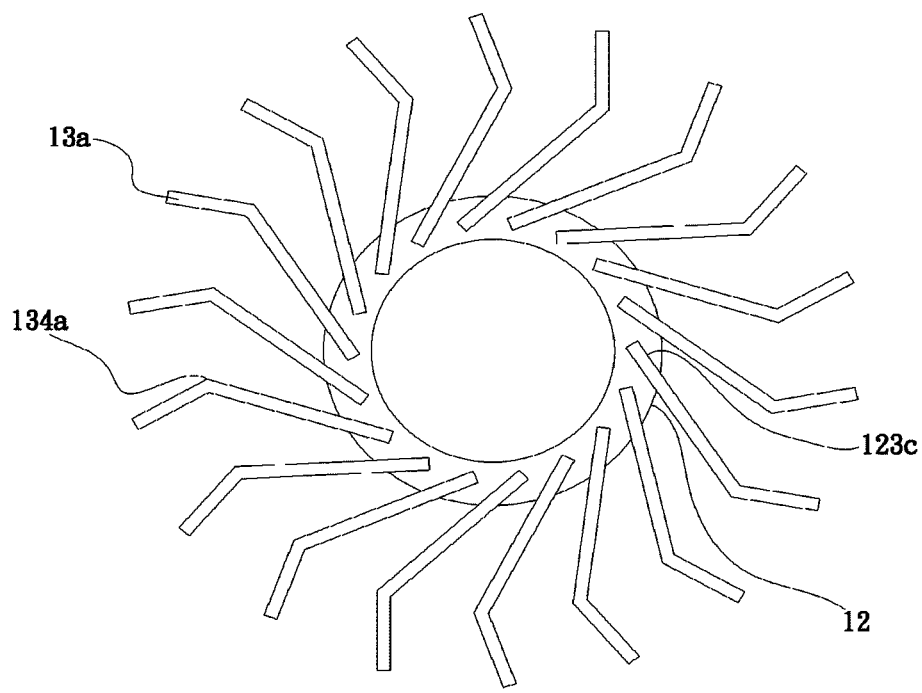
FIG. 7D is a view showing that the first connection section is connected to the main body connection section in the second state, in which the radiating fin has a bending angle.

As shown in FIGS. 7C and 7D, in another embodiment, the first radiating fin 13a has at least one end first bending angle 1234a. In the case that the heat sink is used in cooperation with a cooling fan, the fluid passing through the cooling fan is easy to go into the flow ways between the first radiating fins 13a and then quickly flow out to carry away the heat.

Figure 7E:
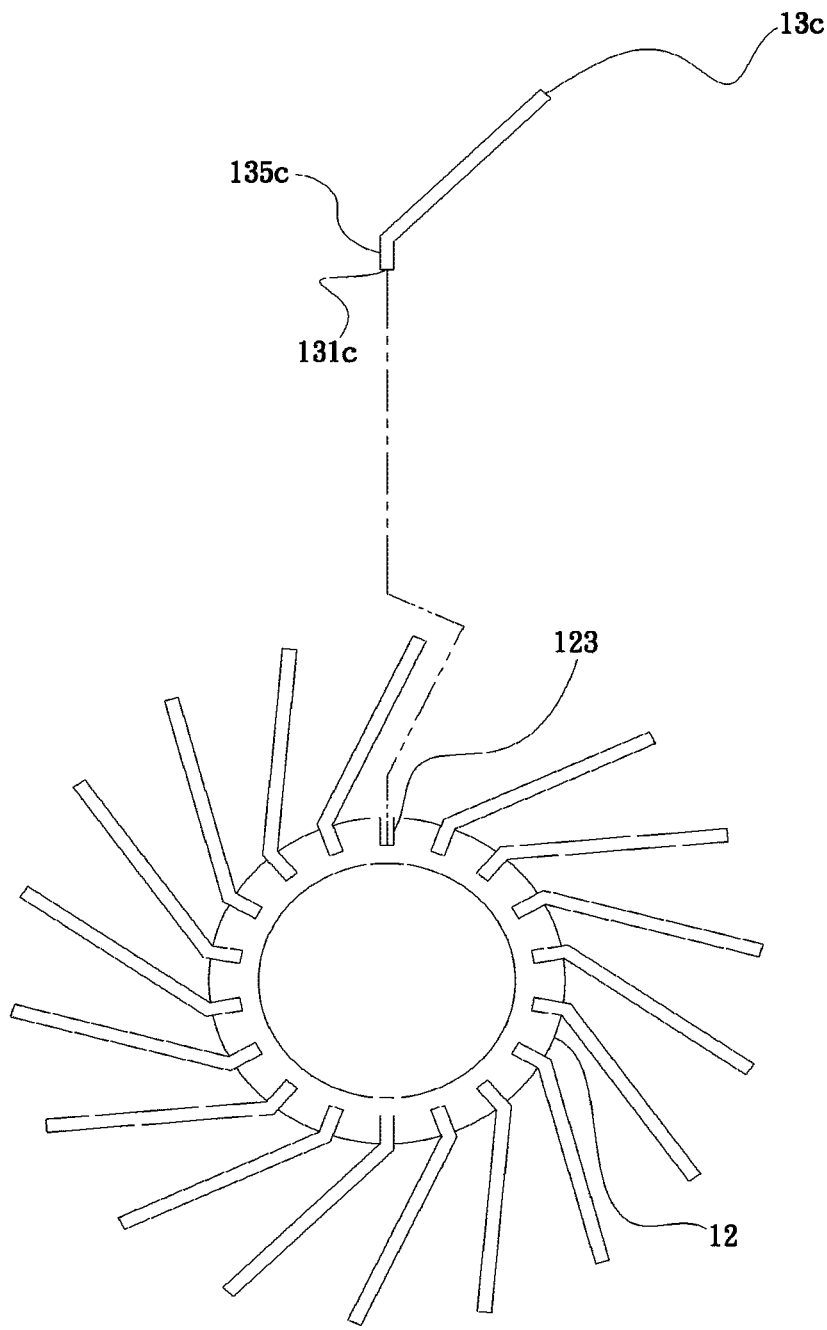
FIG. 7E is a view showing that the first connection section is connected to the main body connection section in the first state, in which the radiating fin has a first bending root section.
Figure 7F:
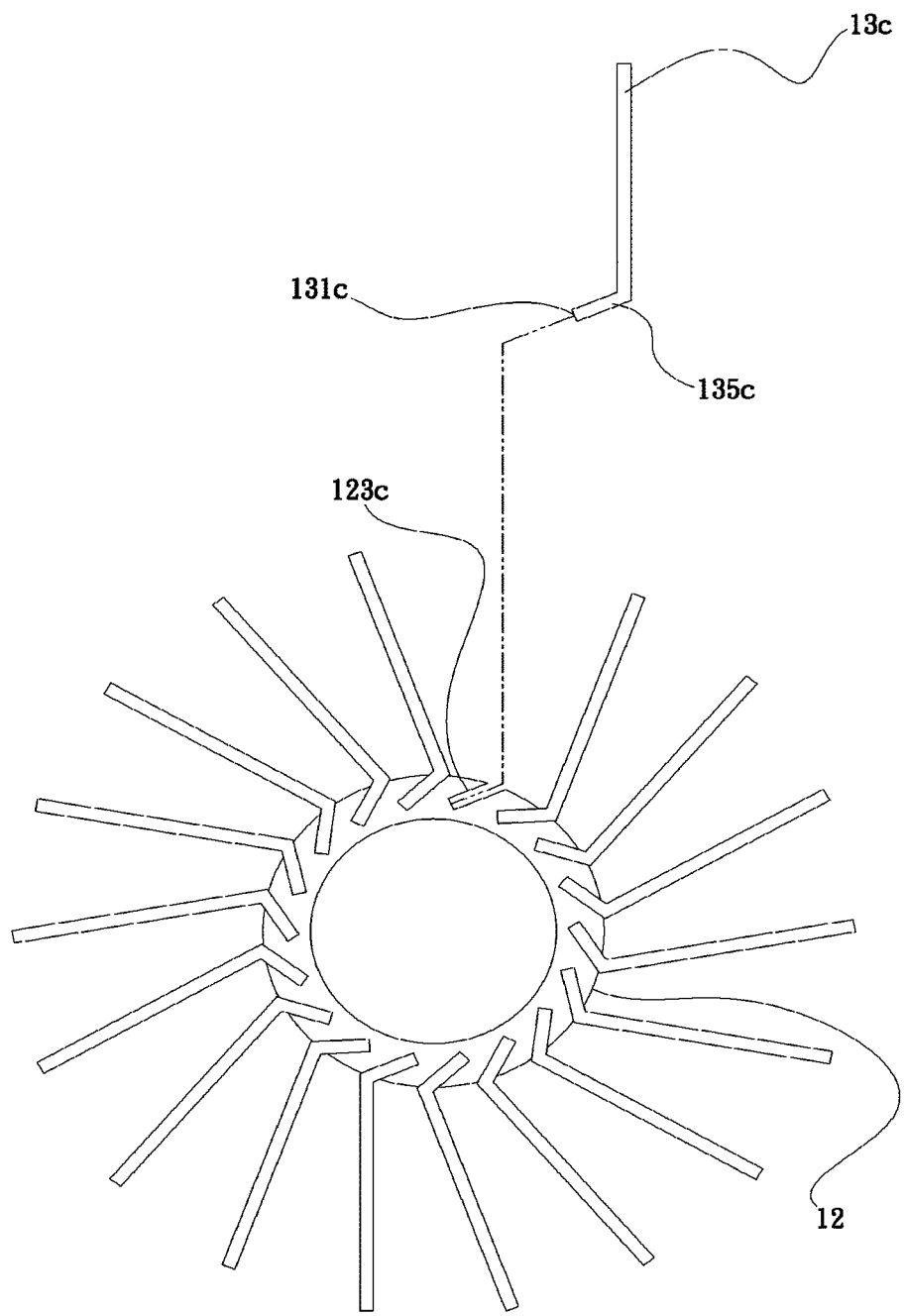
FIG. 7F is a view showing that the first connection section is connected to the main body connection section in the second state, in which the radiating fin has a first bending root section.

As shown in FIGS. 7E and 7F, in another embodiment, the first connection section 131c of the first radiating fin 13c is formed with a first bending root section 135c connected in the main body connection section 123, 123c of the main body 12. Similarly, in the case that the heat sink is used in cooperation with a cooling fan, the fluid passing through the cooling fan is easy to go into the flow ways between the first radiating fins 13c and then quickly flow out to carry away the heat.

Figure 8A:
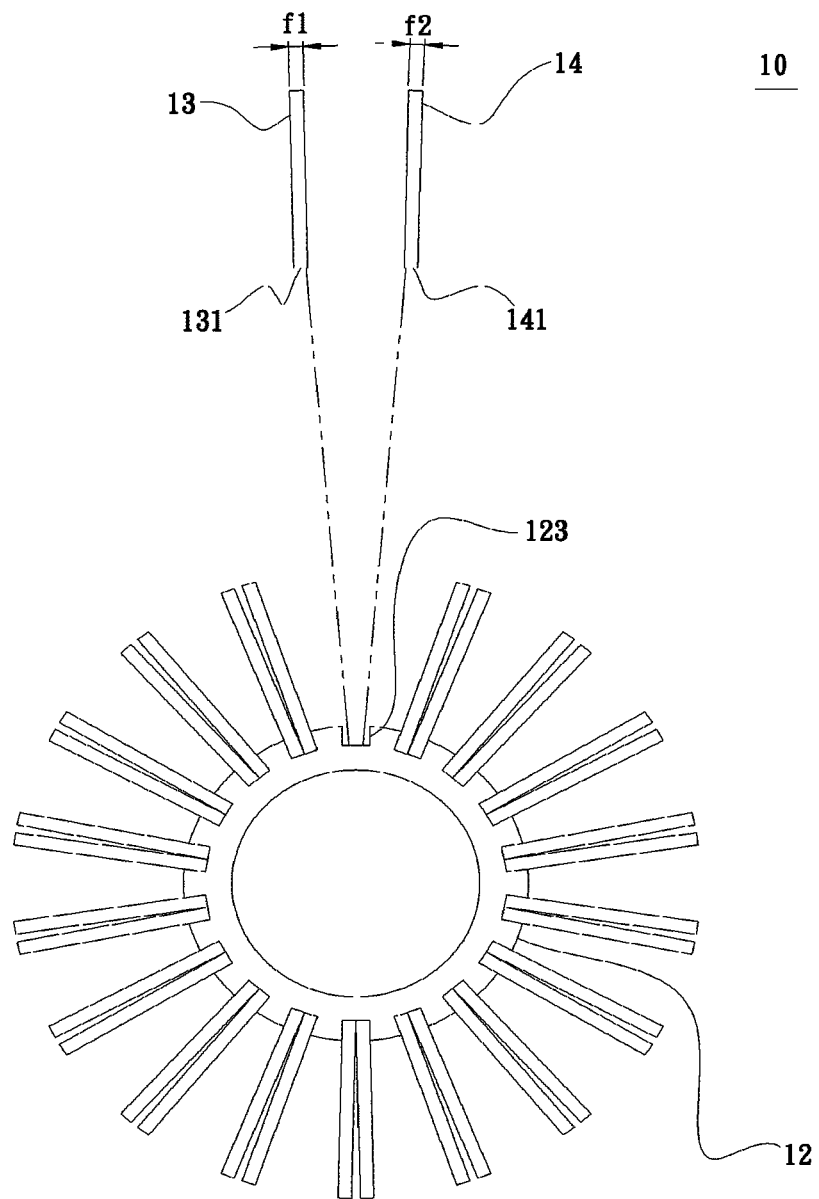
FIG. 8A is a view showing that two radiating fins are connected to one connection channel.

Please now refer to FIG. 8A. Also referring to FIG. 1, in another embodiment, the heat sink further includes multiple second radiating fins 14. Each second radiating fin 14 has a second connection section 141 immediately adjacent to the first connection section 131 of the first radiating fin 13. Along with the first connection section 131, the second connection section 141 is high-speed thrust into the main body connection section 123 from the first end 121 of the main body 12 to the second end 122 in the longitudinal direction a. In this embodiment, the main body connection section 123 is a connection channel, while the first connection section 131 is a first end edge of the first radiating fin 13 and the second connection section 141 is a second end edge of the second radiating fin 14. That is, at least one first connection section 131 and one second connection section 141 are tightly fitted in one connection channel (the main body connection section 123) with the first radiating fin 13 adjacent to the second radiating fin 14.

Moreover, as shown in the drawings, the first radiating fin 13 is straight from the first connection section 131 to an outer free end without bending. Also, the second radiating fin 14 is straight from the second connection section 141 to an outer free end without bending. The first radiating fin 13 has a first thickness f1 and the second radiating fin 14 has a second thickness f2. The first thickness f1 is equal to the second thickness f2.

Figure 8B:
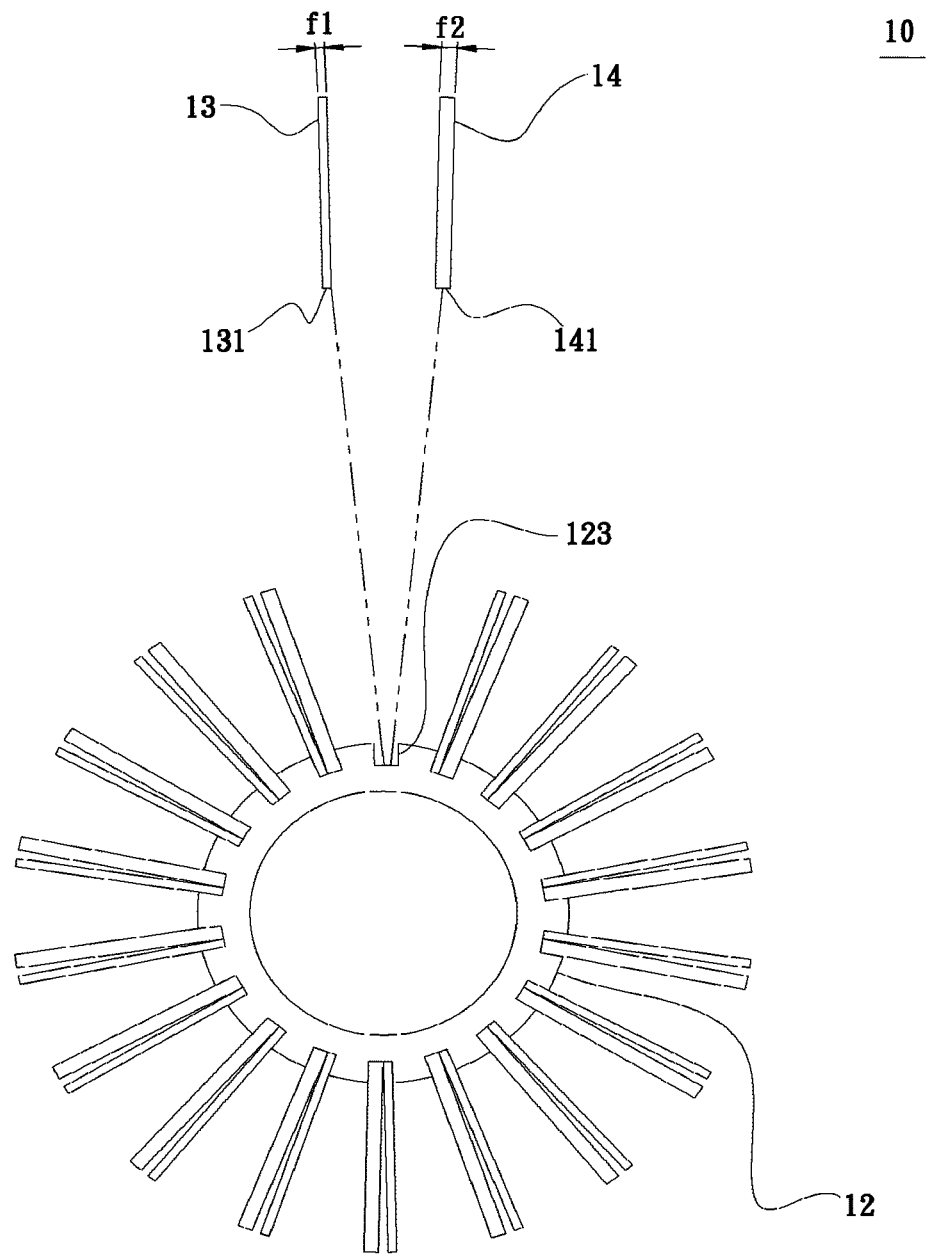
FIG. 8B is a view showing that the two radiating fins have different thicknesses.

As shown in FIG. 8B, in another embodiment, the first thickness f1 of the first radiating fin 13 is unequal to the second thickness f2 of the second radiating fin 14.

The first radiating fin 13 is made of a first material, while the second radiating fin 14 is made of a second material. The first material is a metal material and the second material is also a metal material. The first material is identical or not identical to the second material. The metal is selected from a group consisting of gold, silver, copper and aluminum.

Figure 8C:
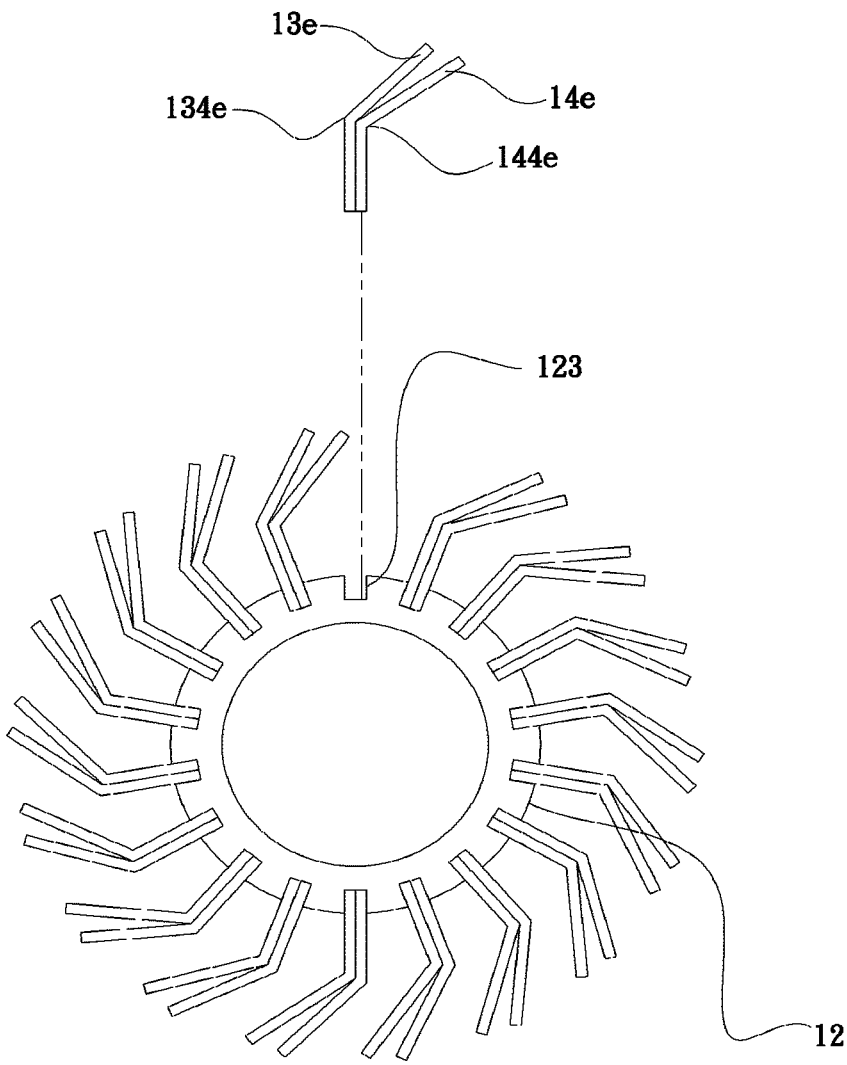
FIG. 8C is a view showing that the two radiating fins have different bending angles.
Figure 8D:
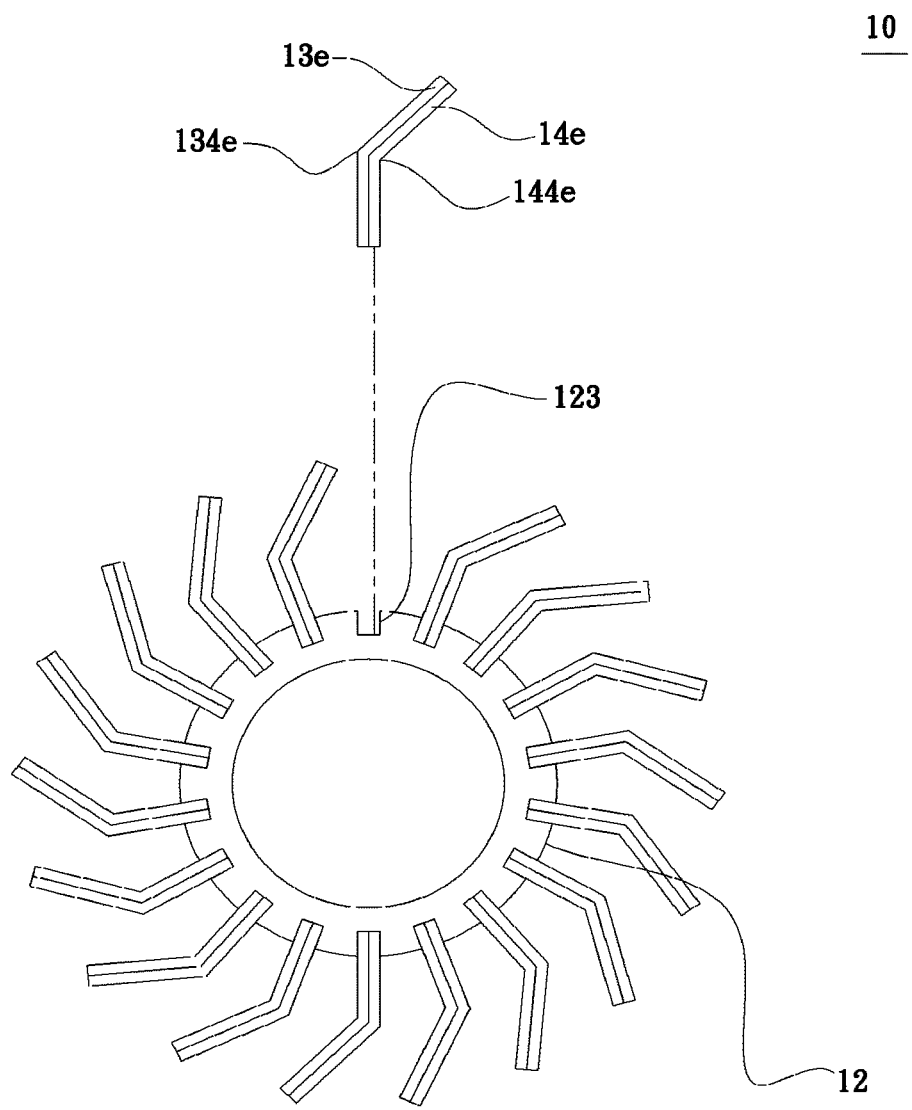
FIG. 8D is a view showing that the two radiating fins have equal bending angles.

As shown in FIGS. 8C and 8D, in another embodiment, the first radiating fin 13e has a first bending angle 134e, while the second radiating fin 14e has a second bending angle 144e. The angle of the first bending angle 134e is unequal to the angle of the second bending angle 144e (as shown in FIG. 8C) or equal to the angle of the second bending angle 144e (as shown in FIG. 8D).

Figure 8E:
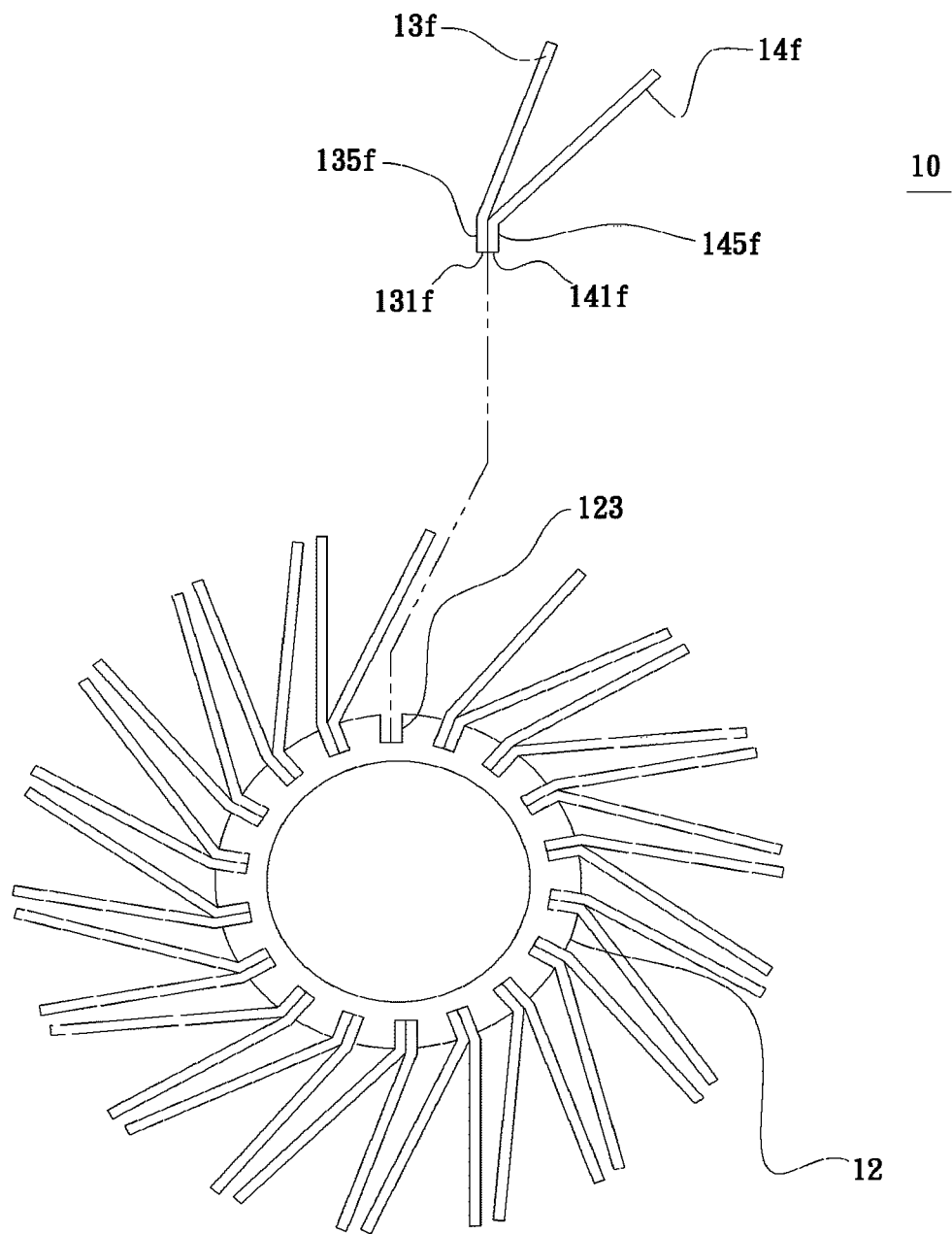
FIG. 8E is a view showing that the two radiating fins have different bending root sections.

As shown in FIG. 8E, in still another embodiment, the first radiating fin 13f is formed with a first bending root section 135f and the second radiating fin 14f is formed with a second bending root section 145f. The first and second bending root sections 135f, 145f are connected in the main body connection section 123 of the main body 12. In this embodiment, the main body connection section 123 is a connection channel, while the first connection section 131f is a first end edge of the first radiating fin 13f and the second connection section 141f is a second end edge of the second radiating fin 14f.

In still another embodiment, the first radiating fin 13 and/or the second radiating fin 14 are equivalently or inequivalently tightly connected to the main body.

Figure 9:
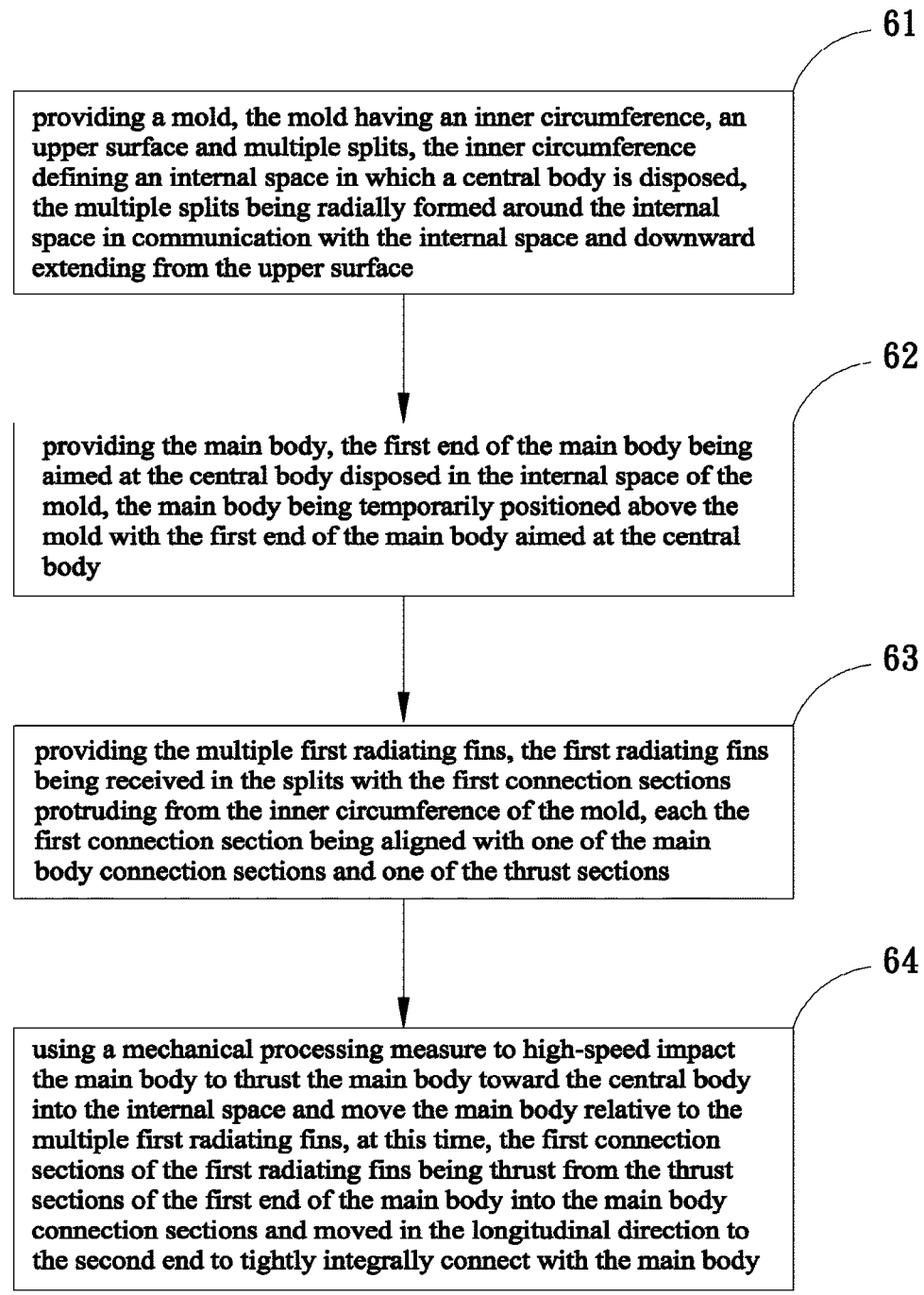
FIG. 9 is a flow chart of the manufacturing method of the present invention.
Figure 10:
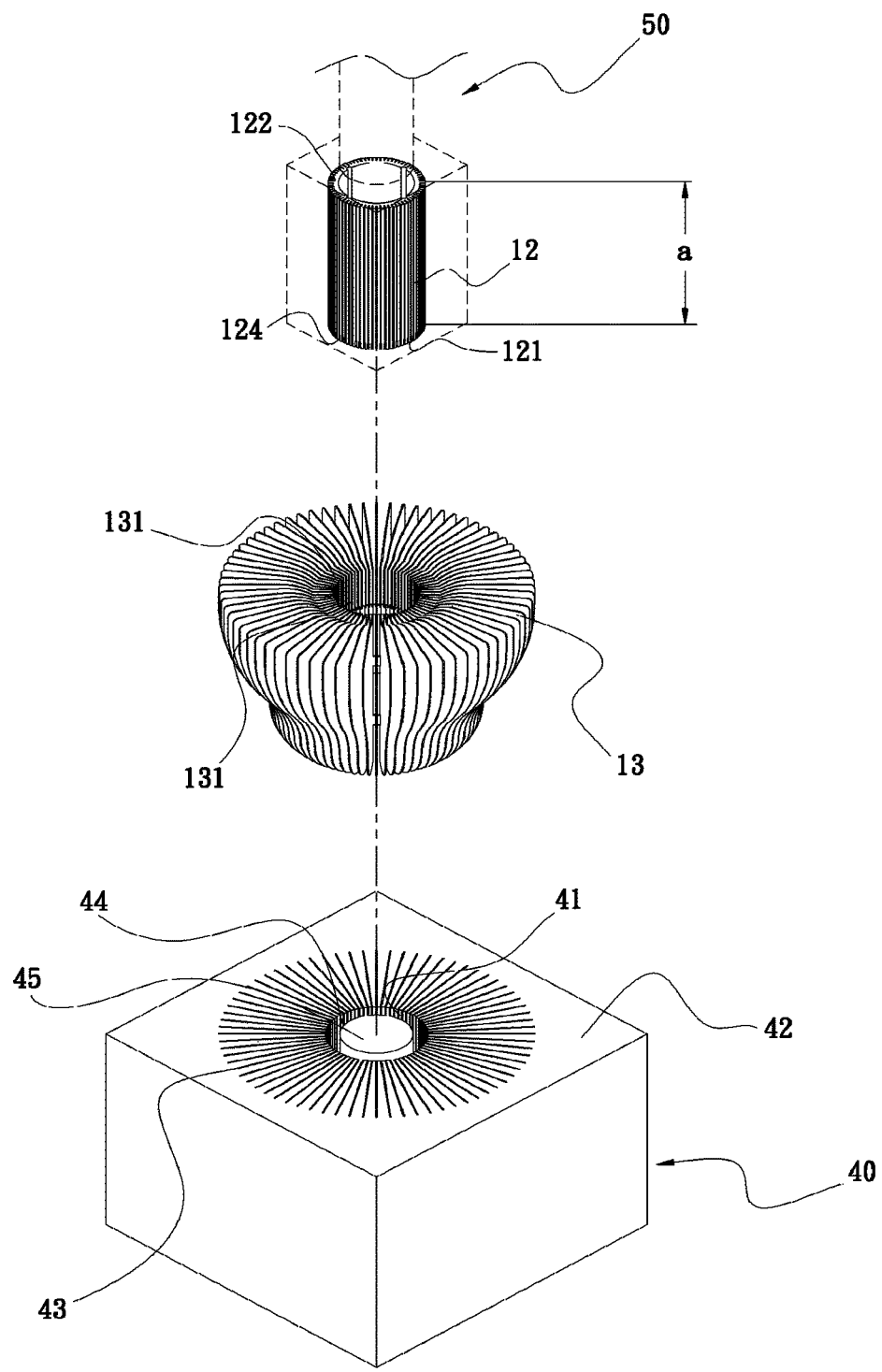
FIG. 10 shows a first step of the manufacturing method of the present invention.
Figure 11A:
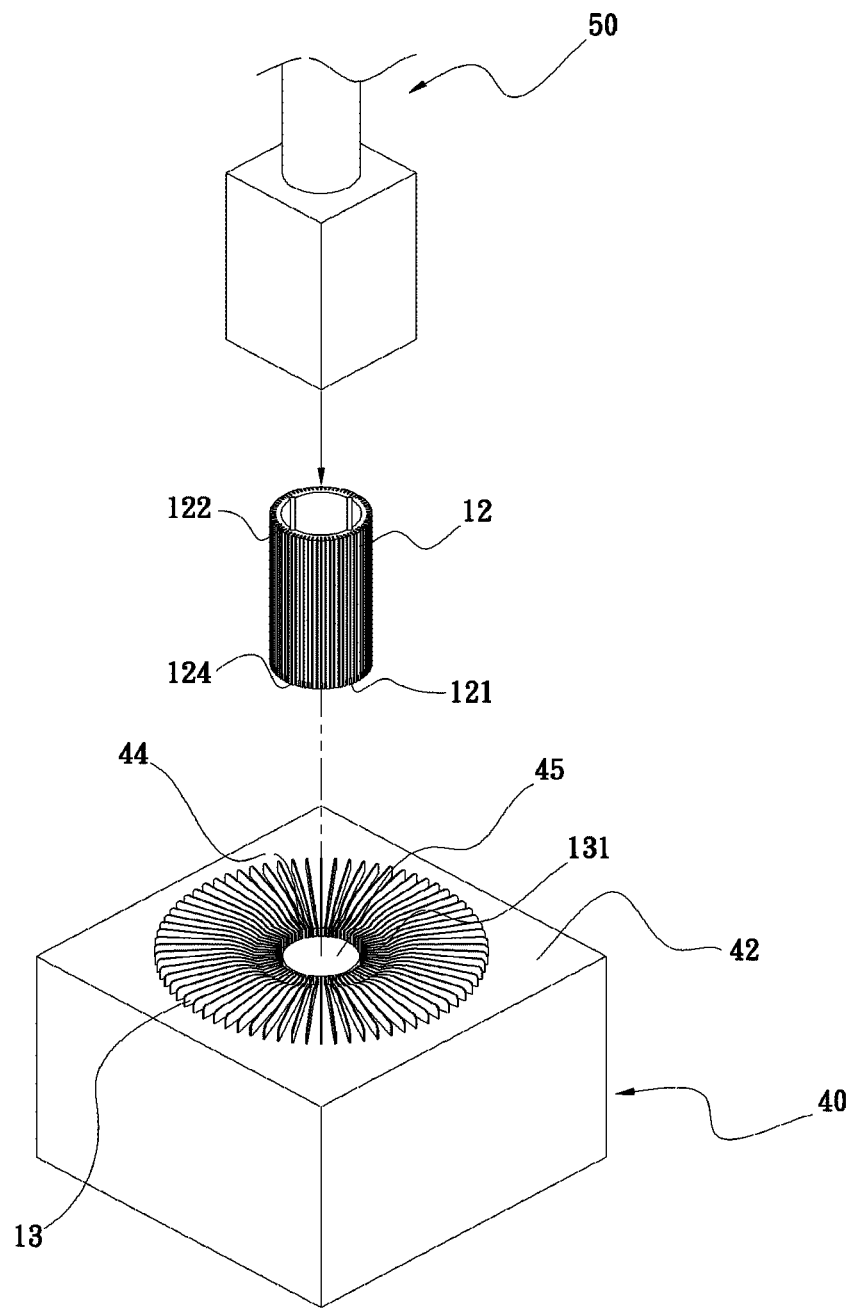
FIG. 11A shows a second step of the manufacturing method of the present invention.
Figure 11B:
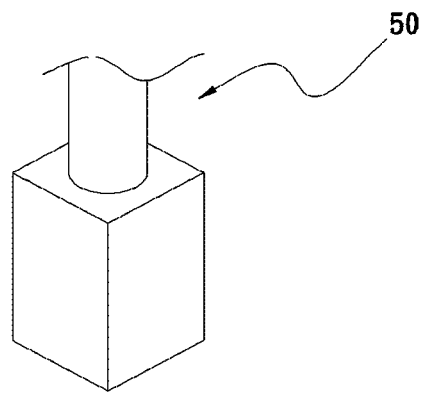
FIG. 11B shows a third step of the manufacturing method of the present invention.
Figure 11B:
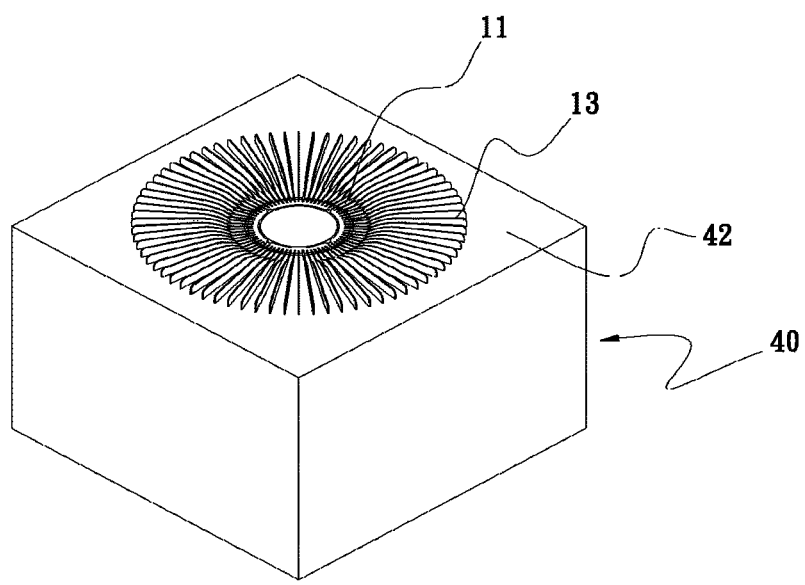

Please further refer to FIGS. 9, 10, 11A and 11B. FIG. 9 is a flow chart of the manufacturing method of the present invention. The manufacturing method of the present invention includes steps of:

61. providing a mold 40 as shown in FIG. 10, the mold 40 having an inner circumference 41, an upper surface 42 and multiple splits 43, the inner circumference 41 defining an internal space 44 in which a central body 45 is disposed, the multiple splits 43 being radially formed around the internal space 44 in communication with the internal space 44 and downward extending from the upper surface 42;

62. providing the main body 12 as shown in FIG. 10, the first end 121 of the main body 12 being aimed at the central body 45 disposed in the internal space 44 of the mold 40, the main body 12 being temporarily positioned above the mold 40 with the first end 121 of the main body 12 aimed at the central body 45;

63. providing the multiple first radiating fins 13 as shown in FIGS. 10 and 11A, the first radiating fins 13 being received in the splits 43 with the first connection sections 131 protruding from the inner circumference 41 of the mold 40, each the first connection section 131 being aligned with one of the main body connection sections 123 and one of the thrust sections 124; and 64. using a mechanical processing measure (air compression effect) to high-speed impact the main body 12 as shown in FIGS. 10, 11A and 11B to thrust the main body 12 toward the central body 45 into the internal space 44 and move the main body 12 relative to the multiple first radiating fins 13, at this time, the first connection sections 131 of the first radiating fins 13 being thrust from the thrust sections 124 of the first end 121 of the main body 12 into the main body connection sections 123 and moved in the longitudinal direction a to the second end 122 to tightly integrally connect with the main body 12.

In step 64, an air compression apparatus 50 serves as a power source for creating compressed air. In the instant of relieving the compressed air, a power is generated to push and drive the main body 12 to thrust into the internal space 44 at high speed. In the meantime, the thrust sections 124 and the main body connection sections 123 are thrust into the first connection sections 131 from upper side of the mold 40 at high speed. Accordingly, the main body 12 is integrally connected with the first radiating fins 13 to form a heat sink 10. The central body 45 serves to ensure that the main body 12 can be downward thrust into the internal space 44 in correct position along the central body 45. The air compression apparatus 50 is, but not limited to, an air compressor.

Referring to FIG. 2, after step 64 is completed, the heat sink 10 is taken out from the mold 40.

In the above embodiments, the main body 12 is a hollow body. Alternatively, in another embodiment, the main body 12 can be a solid body. In the case that the main body 12 is a solid body, no central body is disposed in the internal space 44 of the mold 40.

Figure 12:
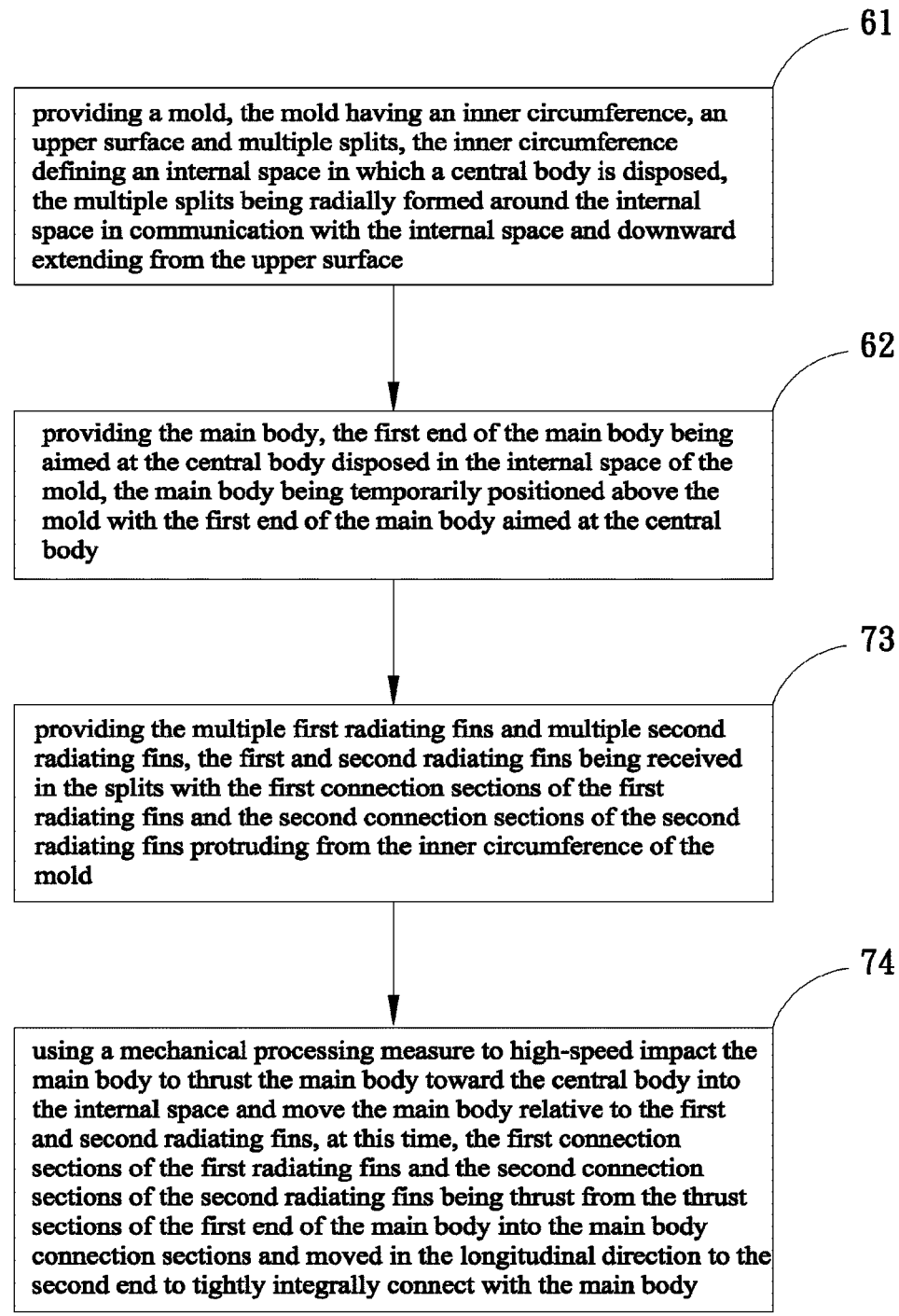
FIG. 12 is a flow chart of another embodiment of the manufacturing method of the present invention.

FIG. 12 is a flow chart of a second embodiment of the manufacturing method of the present invention. The second embodiment is substantially identical to the first embodiment and thus will not be repeatedly described hereinafter. The second embodiment is different from the first embodiment in that after step 62, the second embodiment of the manufacturing method of the present invention includes steps of:

73. providing the multiple first radiating fins 13 and multiple second radiating fins 14, the first and second radiating fins 13, 14 being received in the splits 43 with the first connection sections 131 of the first radiating fins 13 and the second connection sections 141 of the second radiating fins 14 protruding from the inner circumference 41 of the mold 40.

74. using an air compression effect to high-speed impact the main body to thrust the main body 12 toward the central body 45 into the internal space 44 and move the main body 12 relative to the first and second radiating fins 13, 14, at this time, the first connection sections 131 of the first radiating fins 13 and the second connection sections 141 of the second radiating fins 14 being thrust from the thrust sections 124 of the first end 121 of the main body 12 into the main body connection sections 123 and moved in the longitudinal direction a to the second end 122 to tightly integrally connect with the main body 12.

Referring to FIG. 8A, after step 74 is completed, the heat sink 10 is taken out from the mold 40.

The present invention has been described with the above embodiments thereof and it is understood that many changes and modifications in the above embodiments can be carried out without departing from the scope and the spirit of the invention that is intended to be limited only by the appended claims.

What is claimed is:

1. A heat sink structure comprising:
a main body having a first end and a second end, the first and second ends defining a longitudinal direction, multiple main body connection sections being defined between the first and second ends and disposed on a circumference face of the main body, the multiple main body connection sections adjoined in spaced relation with each other a smooth segment of an outer surface of the main body being between the main body connection sections; and
multiple first radiating fins connected with the circumference of the main body, each first radiating fin having a first connection section corresponding to the main body connection section, a compressed air machine used to generate compressed air to drive the main body toward the first radiating fins, whereby the first connection sections of the first radiating fins are thrust from the first end of the main body into the main body connection sections and moved in the longitudinal direction to the second end to tightly fit in the main body connection sections of the main body, the segments of outer surface between the main body connection sections remaining unaffected, the first connection section of each radiating fin having a thickness, the main body connection section having a recess width initially slightly smaller than the thickness of the first connection section;
wherein the main body is formed with multiple thrust sections of a width slightly larger than that of the main body connection sections at one end of the main body connection sections; and
wherein one of the main body connection section and the first connection section is formed with a raised/recessed non-planar surface, while the other of the main body connection section and the first connection section is formed with a planar surface or a raised/recessed non-planar surface.

2. The heat sink structure as claimed in claim 1, wherein one main body connection section is a connection channel, while the first connection section is a first end edge of the first radiating fin.

3. The heat sink structure as claimed in claim 1, wherein the main body connection sections are distributed over the circumference of the main body equivalently or inequivalently.

4. The heat sink structure as claimed in claim 1, wherein the first connection section corresponds to outer surface of the main body and has a guide section, the guide section being a round angle or a reverse angle.

5. The heat sink structure as claimed in claim 1, wherein the first connection section has a right angle.

\* \* \* \* \*